(12) United States Patent
Ma et al.

(10) Patent No.: US 11,460,398 B2
(45) Date of Patent: Oct. 4, 2022

(54) TERAHERTZ SPECTRUM ANALYZER

(71) Applicant: Guangdong University of Technology, Guangzhou (CN)

(72) Inventors: Jianguo Ma, Guangzhou (CN); Shaohua Zhou, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 17 days.

(21) Appl. No.: 17/210,675

(22) Filed: Mar. 24, 2021

(65) Prior Publication Data
US 2022/0065777 A1    Mar. 3, 2022

(30) Foreign Application Priority Data

Sep. 3, 2020 (CN) .......................... 202010916107.6

(51) Int. Cl.
*G01N 21/3581* (2014.01)
(52) U.S. Cl.
CPC ................ *G01N 21/3581* (2013.01)

(58) Field of Classification Search
CPC ............. G01N 21/3581; H01L 27/1443; G01J 3/2823; G01J 3/0202
See application file for complete search history.

(56) References Cited

FOREIGN PATENT DOCUMENTS

WO   WO2020/135717   *   2/2020  ............... G01J 3/01

* cited by examiner

*Primary Examiner* — David P Porta
*Assistant Examiner* — Meenakshi S Sahu
(74) *Attorney, Agent, or Firm* — Yong Chen

(57) ABSTRACT

The present application relates to a new terahertz spectrum analyzer, which adopts a detector based on an NMOSFET gate rasterization structure, a detector based on a Schottky contact rasterization structure, a detector based on an HMET gate rasterization structure, and a detector based on a "wave-to-heat conversion structure", an NMOSFET detector based on a multi-frequency terahertz antenna structure, and an SBD detector based on the multi-frequency terahertz antenna structure as a core component (i.e. sensor) for electromagnetic wave detection, so that the coverage band is wider. In addition, all circuits can be realized by a common integrated circuit process, so that the terahertz spectrum analyzer proposed by the present application has the advantages of small size, low cost, and low power consumption.

9 Claims, 3 Drawing Sheets

TERAHERTZ SPECTRUM ANALYZER

CROSS-REFERENCE TO RELATED APPLICATIONS

The present application claims the priority of Chinese patent application No. 202010916107.6, filed on Sep. 3, 2020, which is hereby incorporated by reference in its entirety.

TECHNICAL FIELD

The present disclosure relates to the technical field of terahertz spectrum analyzers, and in particular to a new terahertz spectrum analyzer.

BACKGROUND

The terahertz spectrum currently has huge and extensive application value in the fields such as industry, medicine, astronomy, security and national defense; and it cannot be ignored. Compared with electromagnetic waves in other frequency bands, terahertz electromagnetic waves have unique properties. The terahertz electromagnetic waves have a high penetration rate for many dielectric materials and non-polar liquids, and thus can be applied in the fields such as security inspections, medical imaging, and non-destructive testing. In addition, compared with X-ray that can also pass through most objects, the photon energy of terahertz electromagnetic waves is only about one hundred thousandth of X-ray, and is lower than the bond energy of various chemical bonds. Thus, they will not cause harm to tested objects (especially living organisms). Moreover, many organic molecules have their own special absorption spectra for electromagnetic waves in the terahertz band. The absorption spectrum of each molecule is a "fingerprint" of the molecule, which means that the terahertz spectroscopy plays an important role in the identification of the composition of substances. It can be expected that there will be widespread demand for terahertz spectrum analyzers.

However, the existing terahertz spectrum analyzers (spectrometers) has prominent defects of narrow band detection range (for example, a PB7200 terahertz spectrometer launched by EMCORE in the United States at the end of 2011 has a coverage band of only 0.1 THz to 2 THz), large volume (for example, the PB7200 terahertz spectrometer has a size up to 28 cm×22 cm×7.5 cm), high power consumption, high cost, and so on. The reason is that the current research of international and domestic terahertz spectrometers (spectrum analyzers) is still at the level of time-domain spectroscopy that has been used for more than 20 years.

Therefore, in order to fundamentally greatly improve the band detection range, reduce the cost and reduce the device volume, it is far from enough to improve the original time-domain spectroscopy technology and its corresponding process. Thus, it is urgent to introduce new theories and ideas of THz spectrum detection, which will fundamentally deepen the understanding of the mechanism of terahertz electromagnetic wave detection. On this basis, a new terahertz spectrum analyzer with the above indicators to a higher level can be developed.

Unlike the existing terahertz spectrum detection method based only on a single optical theory, the present disclosure adopts a brand-new concept and proposes a new spectrum analyzer (spectrometer) characterized by the conversion of multiple physical processes (including electromagnetic propagation, solid-state electrons, heat conduction, light transmission, etc.) and capable of detecting wide-band terahertz energy.

SUMMARY

An objective of the present disclosure is to overcome the shortcomings of the prior art and provide a new terahertz spectrum analyzer with a wide coverage band, a small volume, low power consumption and low cost.

In order to achieve the above objective, the technical solution provided by the present disclosure is:

a new terahertz spectrum analyzer, comprising an outer packaging casing, a terahertz near-optical lens, a circuit board, a digital signal processor, a field programmable logic array, a power supply circuit, a digital and analog external circuit, a signal external connector and a terahertz chip detector;

wherein the terahertz near-optical lens and the signal external connector are installed at two ends of the outer packaging casing, respectively; the circuit board, the digital signal processor, the field programmable logic array, the power supply circuit, the digital and analog external circuit and the terahertz chip detector are built in the outer packaging casing, and the digital signal processor, the field programmable logic array, the power supply circuit, the digital and analog external circuit and the terahertz chip detector are all integrated on the circuit board, and power is supplied by the power supply circuit to each circuit module;

the terahertz chip detector is placed in the middle of the circuit board and faces the terahertz near-optical lens, and it is connected to the digital signal processor and the field programmable logic array through the digital and analog external circuit; and the circuit board integrated with the digital signal processor, the field programmable logic array, the power supply circuit, the digital and analog external circuit and the terahertz chip detector is connected to the signal external connector.

Further, the terahertz chip detector is composed of an SBD detector array based on a multi-frequency terahertz antenna structure, a detector array based on a Schottky contact rasterization structure, an NMOSFET detector array based on a multi-frequency terahertz antenna structure, a detector array based on an NMOSFET gate rasterization structure, a detector array based on an HMET gate rasterization structure, a detector array based on a wave-heat conversion structure, and switches S1, S2, S3, S4, S5 and S6; and the SBD detector array based on the multi-frequency terahertz antenna structure, the detector array based on the Schottky contact rasterization structure, the NMOSFET detector array based on the multi-frequency terahertz antenna structure, the detector array based on the NMOSFET gate rasterization structure, the detector array based on the HMET gate rasterization structure, the detector array based on the wave-heat conversion structure are connect to an output terminal $D_{out}$ through the switches S1, S2, S4, S5, S3, and S6, respectively.

Further, the detector array based on the Schottky contact rasterization structure comprises N×M second detector units, N second row selection switches, and M second column selection switches;

wherein each second detector unit comprises a second SBD with a Schottky contact rasterization structure, a DC blocking capacitor C2, a bias voltage Vb2, a bias resistor Rb2, and a second NMOSFET;

a cathode of the second SBD is grounded, and the bias voltage Vb2 and the bias resistor Rb2 are loaded on an anode of the second SBD for supplying power to it; and the anode of the second SBD is connected to one end of the DC blocking capacitor C2, and the other end of the DC blocking capacitor C2 is connected to an $M_{SEL1}$ terminal of the second NMOSFET, an SEL1 terminal of the second NMOSFET is connected to a second column selection switch in a column where it is located, and a $V_{out1}$ terminal of the second NMOSFET is connected to a second row selection switch in a row where it is located; and
the N second row selection switches are all connected to the switch S2.

Further, the second SBD with the Schottky contact rasterization structure is an SBD in which the anode is converted into a rasterization structure, and has a trench that forms a raster-like structure.

Further, the NMOSFET detector array based on the multi-frequency terahertz antenna structure comprises N×M third detector units, N third row selection switches, and M third column selection switches;
wherein each third detector unit comprises a second multi-frequency-point terahertz antenna, a second matching network having transmission lines TL4 and TL5, a field effect transistor, a bias voltage Vb3, a bias resistor Rb3, and a third NMOSFET;
the second multi-frequency-point terahertz antenna is connected to a left port of the transmission line TL4, a right port of the transmission line TL4 is connected to an M1 port of the field effect transistor, and the bias voltage Vb3 and the bias resistor Rb3 are loaded on a gate of the field effect transistor for supplying power to the field effect transistor; the transmission line TL5 is connected to the gate of the field effect transistor for eliminating the influence of the gate DC bias on the impedance matching between the antenna and the transistor;
a drain of the field effect transistor is connected to an $M_{SEL2}$ terminal of the third NMOSFET, an SEL2 terminal of the third NMOSFET is connected to a third column selection switch of a column where it is located, and a $V_{out2}$ terminal of the third NMOSFET is connected to a third row selection switch of a row where it is located;
the N third row selection switches are all connected to the switch S4; and port impedance of the second multi-frequency-point terahertz antenna is consistent with left port impedance of the transmission line TL4, and right port impedance of the transmission line TL4 is consistent with M1 port impedance of the field effect transistor.

Further, the detector array based on the NMOSFET gate rasterization structure comprises N×M fourth detector units, N fourth row selection switches, and M fourth column selection switches;
wherein each fourth detector unit comprises an NMOSFET with a gate rasterization structure, a bias voltage Vb4, a bias resistor Rb4, and a fourth NMOSFET;
a source of the NMOSFET with the gate rasterization structure is grounded, a drain is connected to an $M_{SEL3}$ terminal of the fourth NMOSFET, an SEL3 terminal of the fourth NMOSFET is connected to a fourth column selection switch in a column where it is located, and a $V_{out3}$ terminal of the fourth NMOSFET is connected to a fourth row selection switch of a row where it is located;
the bias voltage Vb4 and the bias resistor Rb4 are loaded on a gate of the NMOSFET with the gate rasterization structure for supplying power to the NMOSFET with the gate rasterization structure; and the N fourth row selection switches are all connected to the switch S5.

Further, the detector array based on the HMET gate rasterization structure comprises N×M fifth detector units, N fifth row selection switches, and M fifth column selection switches; wherein each fifth detector unit comprises a HEMT with a gate rasterization structure and a fifth NMOSFET; a source of the HEMT with the gate rasterization structure is grounded, and a drain is connected to an $M_{SEL4}$ terminal of the fifth NMOSFET; and an SEL4 terminal of the fifth NMOSFET is connected to a fifth column selection switch in a column where it is located, and a $V_{out4}$ terminal is connected to a fifth row selection switch in a row where it is located.

Further, the detector array based on the wave-heat conversion structure comprises N×M sixth detector units, N sixth row selection switches, and M sixth column selection switches;
wherein each sixth detector unit comprises a frequency selection surface, a PTAT circuit, and a sixth NMOSFET; the PTAT circuit is located under the frequency selection surface, and its output terminal is connected to an $M_{SEL5}$ terminal of the sixth NMOSFET; and an SEL5 terminal of the sixth NMOSFET is connected to a sixth column selection switch of a column where it is located, and a $V_{out5}$ terminal is connected to a sixth row selection switch of a column where it is located.

Compared with the prior art, the principle and advantages of the present solution are as follows:

1. The idea of the rasterization of the gate is proposed and it is combined with the Schottky diode (SBD) and the field effect transistor (NMOSFET). Through a periodic SBD structure and a periodic NMOSFET structure, a raster-like trench is formed in the trench to realize the enhancement of resonance between plasmons in the substrate and plasmonic behavior in the gate; and the method of the rasterized gate can be adopted to reduce the problems such as weak terahertz signals in the space, weak plasmonic behavior excited by the metal structure on the gate, and diffusion and loss in the propagation process.

2. The detector based on the NMOSFET gate rasterization structure, the detector based on the Schottky contact rasterization structure, the detector based on the HMET gate rasterization structure, and the detector based on the "wave-to-heat conversion structure", the NMOSFET detector based on the multi-frequency terahertz antenna structure, and the SBD detector based on the multi-frequency terahertz antenna structure are adopted as a core component (i.e. sensor) for electromagnetic wave detection, so that it is expected to realize a terahertz spectrum analyzer with the widest coverage band range in the world.

3. All circuits can be realized by a common integrated circuit process, so that the terahertz spectrum analyzer proposed by the present solution has the advantages of small size, low cost, and low power consumption.

4. It can not only overcome the defect that the electronic sensor loses rectification ability in the terahertz frequency band, but also break through the bottleneck that the optoelectronic assembly cannot excite terahertz photons.

BRIEF DESCRIPTION OF THE DRAWINGS

In order to more clearly illustrate the technical solutions in embodiments of the present disclosure or the prior art, the services that need to be used in the description of the embodiments or the prior art will be briefly described below. Obviously, the drawings in the following description are only some embodiments of the present disclosure, and other drawings can be obtained by those of ordinary skill in the art from these without creative efforts.

DETAILED DESCRIPTION

Figure 1:
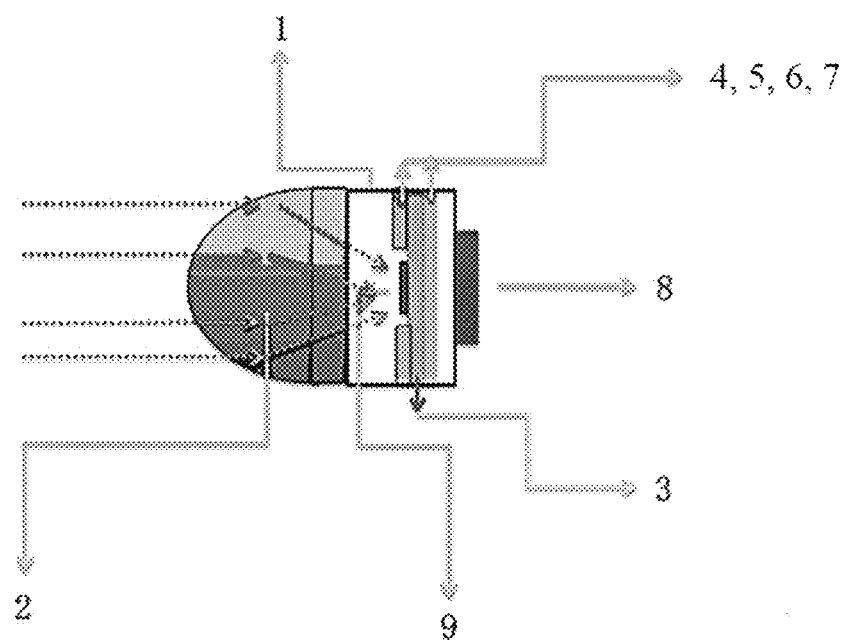
FIG. 1 is a structural schematic diagram of a new terahertz spectrum analyzer according to the present disclosure.

The present disclosure will be further described below in conjunction with specific embodiments:

As shown in FIG. 1, a new terahertz spectrometer includes an outer packaging casing 1, a terahertz near-optical lens 2, a circuit board 3, a digital signal processor 4, a field programmable logic array 5, a power supply circuit 6, a digital and analog external circuit 7, a signal external connector 8 and a terahertz chip detector 9.

Among them, the terahertz near-optical lens 2 has a diameter of about 50 mm, and it and the signal external connector 8 are installed at two ends of the outer packaging casing 1, respectively. The circuit board 3, the digital signal processor 4, the field programmable logic array 5, the power supply circuit 6, the digital and analog external circuit 7 and the terahertz chip detector 9 are built in the outer packaging casing 1, and the digital signal processor 4, the field programmable logic array 5, the power supply circuit 6, the digital and analog external circuit 7 and the terahertz chip detector 9 are all integrated on the circuit board 3, and power is supplied by the power supply circuit 6 to each circuit module.

Specifically, the terahertz chip detector 9 is placed in the middle of the circuit board 3 (on a circle with a diameter (inner diameter) of about 5 mm) and faces the terahertz near-optical lens 2, and it is connected to the digital signal processor 4 and the field programmable logic array 5 through the digital and analog external circuit 7.

The circuit board 3 integrated with the digital signal processor 4, the field programmable logic array 5, the power supply circuit 6, the digital and analog external circuit 7 and the terahertz chip detector 9 is connected to the signal external connector 8.

Figure 2A:
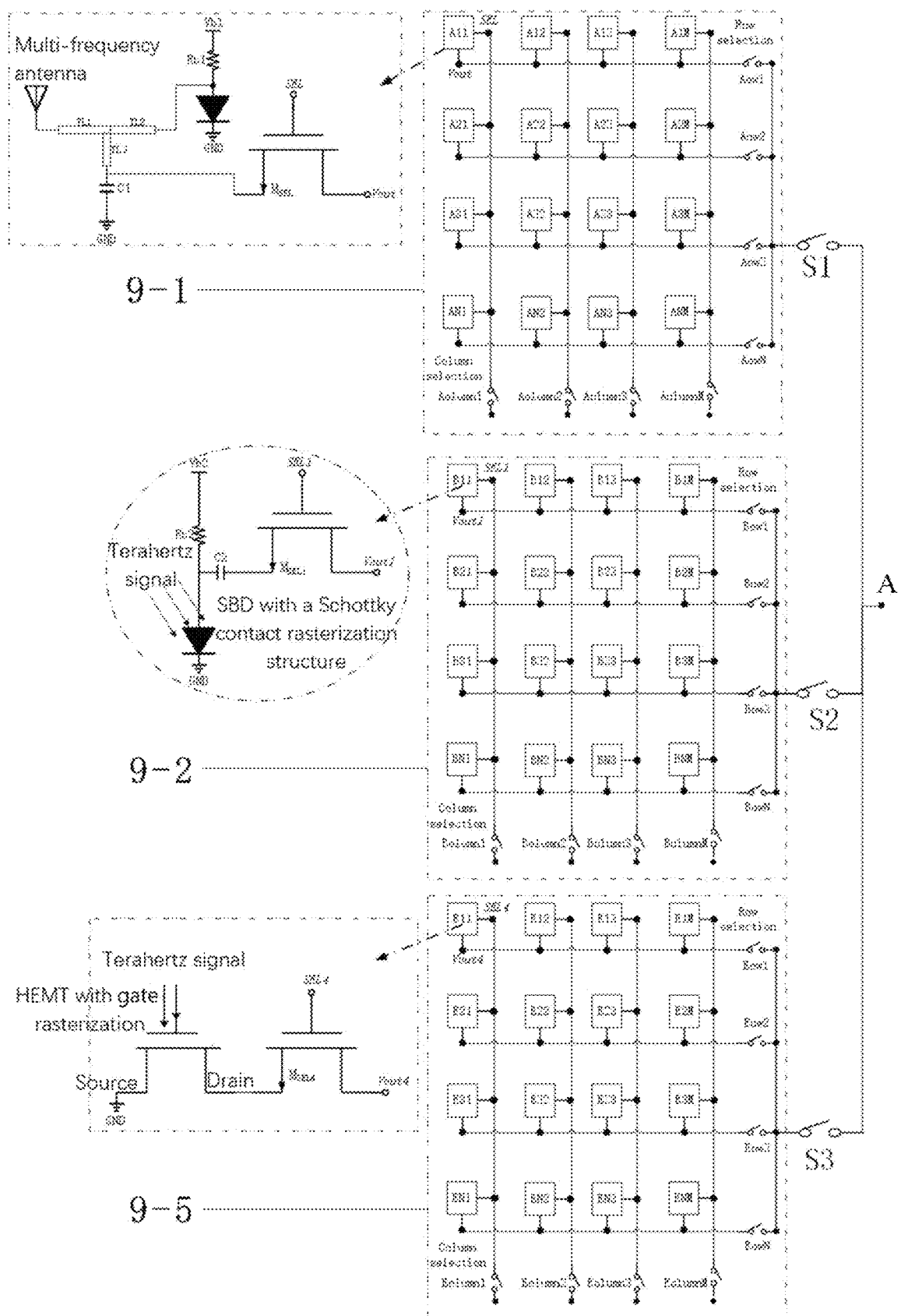
FIG. 2A and FIG. 2B, connected at point "A", jointly show a structural schematic diagram of a terahertz chip detector in the new terahertz spectrum analyzer according to the present disclosure.
Figure 2B:
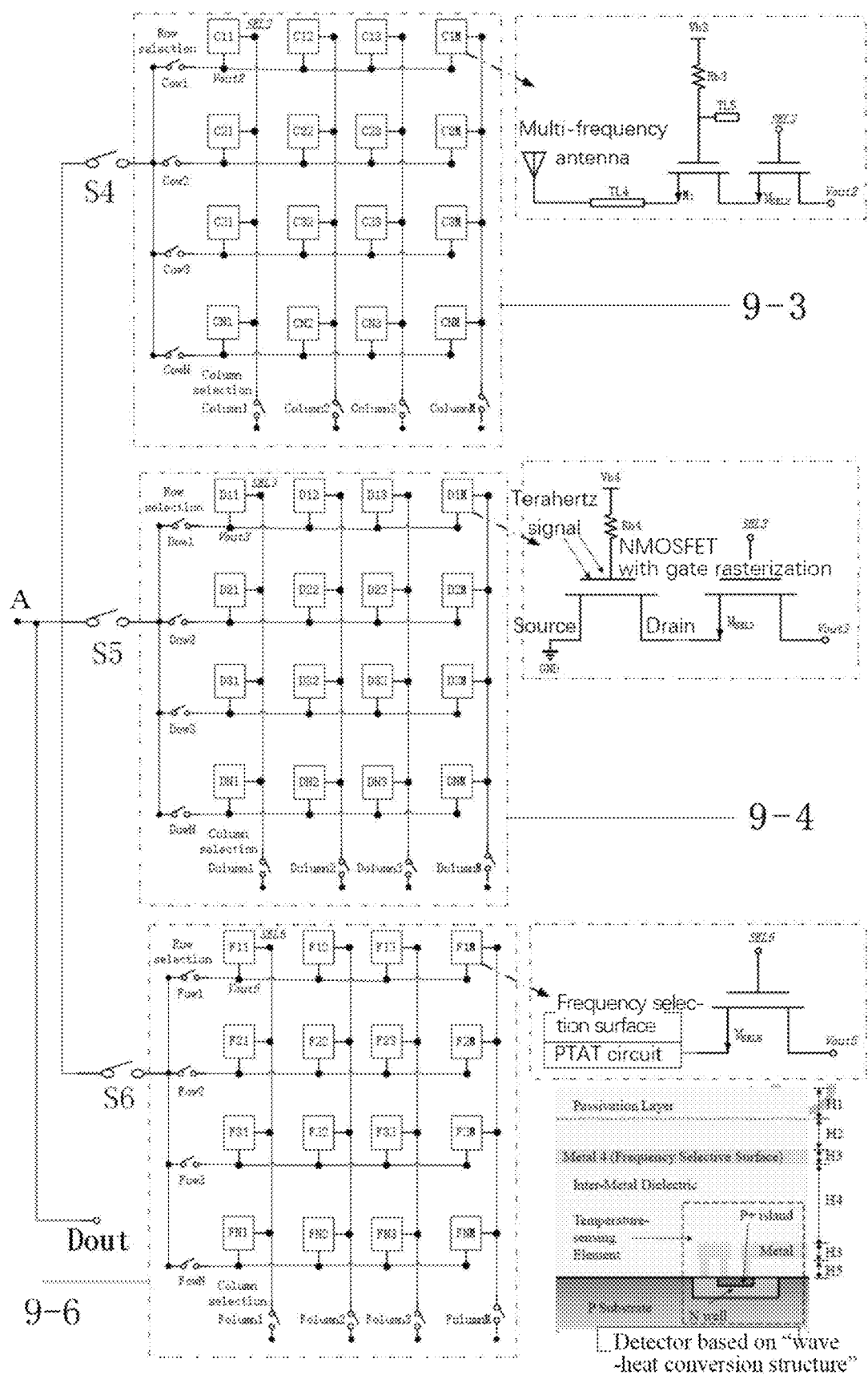

Specifically, as shown in FIGS. 2A and 2B, the terahertz chip detector 9 is composed of an SBD detector array 9-1 based on a multi-frequency terahertz antenna structure, a detector array 9-2 based on a Schottky contact rasterization structure, an NMOSFET detector array 9-3 based on a multi-frequency terahertz antenna structure, a detector array 9-4 based on an NMOSFET gate rasterization structure, a detector array 9-5 based on an HMET gate rasterization structure, a detector array 9-6 based on a wave-heat conversion structure, and switches S1, S2, S3, S4, S5 and S6.

The SBD detector array 9-1 based on the multi-frequency terahertz antenna structure, the detector array 9-2 based on the Schottky contact rasterization structure, the NMOSFET detector array 9-3 based on the multi-frequency terahertz antenna structure, the detector array 9-4 based on the NMOSFET gate rasterization structure, the detector array 9-5 based on the HMET gate rasterization structure, the detector array 9-6 based on the wave-heat conversion structure are connect to an output terminal $D_{out}$ through the switches S1, S2, S4, S5, S3, and S6, respectively.

Among them, the SBD detector array 9-1 based on the multi-frequency terahertz antenna structure includes N×M first detector units (A11, A12, A13, ..., ANM), N first row selection switches (Aow1, Aow2, Aow3, ..., AowN), and M first column selection switches (Aolumn1, Aolumn2, Aolumn3, ..., AolumnM); each first detector unit includes a first multi-frequency-point terahertz antenna (the multi-frequency-point terahertz antenna can receive terahertz signals at multiple arbitrary different frequency points (the bandwidth of each frequency point can be designed as a narrow band according to actual needs)), a first matching network having transmission lines TL1, TL2, and TL3, a DC blocking capacitor C1, a bias voltage Vb1, a bias resistor Rb1, a first SBD, and a first NMOSFET; the multi-frequency-point terahertz antenna is connected to a left port of the transmission line TL1, a right port of the transmission line TL2 is connected to an anode of the first SBD, a cathode of the first SBD is grounded, and the bias voltage Vb1 and the bias resistor Rb1 are loaded on the anode of the first SBD for supplying power to the first SBD; a lower end of the transmission line TL3 is separately connected to one end of the DC blocking capacitor C1 and an $M_{SEL}$ terminal of the first NMOSFET; the other end of the DC blocking capacitor C1 is grounded; an SEL terminal of the first NMOSFET is connected to a first column selection switch in a column where it is located, and a $V_{out}$ terminal of the first NMOSFET is connected to a first row selection switch in a row where it is located; the N first row selection switches are all connected to the switch S1; and port impedance of the multi-frequency-point terahertz antenna is consistent with left port impedance of the transmission line TL1, the left port impedance of the transmission line TL1 is consistent with right port impedance of the transmission line TL2, and the right port impedance of the transmission line TL2 is consistent with port impedance of the anode of the Schottky diode.

The detector array 9-2 based on the Schottky contact rasterization structure includes N×M second detector units (B11, B12, B13, ..., BNM), N second row selection switches (Bow1, Bow2, Bow3, ..., BowN), and M second column selection switches (Bolumn1, Bolumn2, Bolumn3, ..., BolumnM); each second detector unit includes a second SBD with a Schottky contact rasterization structure, a DC blocking capacitor C2, a bias voltage Vb2, a bias resistor Rb2, and a second NMOSFET; a cathode of the second SBD is grounded, and the bias voltage Vb2 and the bias resistor Rb2 are loaded on its anode for supplying power to it; the anode of the second SBD is connected to one end of the DC blocking capacitor C2, and the other end of the DC blocking capacitor C2 is connected to an $M_{SEL1}$ terminal of the second NMOSFET, an SEL1 terminal of the second NMOSFET is connected to a second column selection switch in a column where it is located, and a $V_{out1}$ terminal of the second NMOSFET is connected to a second row selection switch in a row where it is located; the N second row selection switches are all connected to the switch S2; and the second SBD with the Schottky contact rasterization structure is an SBD in which the anode is converted into a rasterization structure, and has a trench that forms a raster-like structure.

The NMOSFET detector array 9-3 based on the multi-frequency terahertz antenna structure includes N×M third detector units (C11, C12, C13, ..., CNM), N third row selection switches (Cow1, Cow2, Cow3, ..., CowN), and M third column selection switches (Column1, Column2, Column3, ..., ColumnM); each third detector unit includes a second multi-frequency-point terahertz antenna, a second matching network having transmission lines TL4 and TL5, a field effect transistor, a bias voltage Vb3, a bias resistor Rb3, and a third NMOSFET; the second multi-frequencypoint terahertz antenna is connected to a left port of the transmission line TL4, a right port of the transmission line TL4 is connected to an M1 port of the field effect transistor, and the bias voltage Vb3 and the bias resistor Rb3 are loaded on a gate of the field effect transistor for supplying power to the field effect transistor; the transmission line TL5 is connected to the gate of the field effect transistor for eliminating the influence of the gate DC bias on the impedance matching between the antenna and the transistor; a drain of the field effect transistor is connected to an $M_{SEL2}$ terminal of the third NMOSFET, an SEL2 terminal of the third NMOSFET is connected to a third column selection switch of a column where it is located, and a $V_{out2}$ terminal of the third NMOSFET is connected to a third row selection switch of a row where it is located; the N third row selection switches are all connected to the switch S4; and port impedance of the second multi-frequency-point terahertz antenna is consistent with left port impedance of the transmission line TL4, and right port impedance of the transmission line TL4 is consistent with M1 port impedance of the field effect transistor.

The detector array 9-4 based on the NMOSFET gate rasterization structure includes N×M fourth detector units (D11, D12, D13, . . . , DNM), N fourth row selection switches (Dow1, Dow2, Dow3, . . . , DowN), and M fourth column selection switches (Dolumn1, Dolumn2, Dolumn3, . . . , DolumnM); each fourth detector unit includes an NMOSFET with a gate rasterization structure, a bias voltage Vb4, a bias resistor Rb4, and a fourth NMOSFET; a source of the NMOSFET with the gate rasterization structure is grounded, a drain is connected to an $M_{SEL3}$ terminal of the fourth NMOSFET, an SEL3 terminal of the fourth NMOSFET is connected to a fourth column selection switch in a column where it is located, and a $V_{out3}$ terminal of the fourth NMOSFET is connected to a fourth row selection switch of a row where it is located; the bias voltage Vb4 and the bias resistor Rb4 are loaded on a gate of the NMOSFET with the gate rasterization structure for supplying power to the NMOSFET with the gate rasterization structure; and the N fourth row selection switches are all connected to the switch S5.

The detector array 9-5 based on the HMET gate rasterization structure includes N×M fifth detector units (E11, E12, E13, . . . , ENM), N fifth row selection switches (Eow1, Eow2, Eow3, . . . , EowN), and M fifth column selection switches (Eolumn1, Eolumn2, Eolumn3, . . . , EolumnM); each fifth detector unit includes a HEMT with a gate rasterization structure and a fifth NMOSFET; a source of the HEMT with the gate rasterization structure is grounded, and a drain is connected to an $M_{SEL4}$ terminal of the fifth NMOSFET; and an SEL4 terminal of the fifth NMOSFET is connected to a fifth column selection switch in a column where it is located, and a $V_{out4}$ terminal is connected to a fifth row selection switch in a row where it is located.

The detector array 9-6 based on the wave-heat conversion structure includes N×M sixth detector units (F11, F12, F13, . . . , FNM), N sixth row selection switches (Fow1, Fow2, Fow3, . . . , FowN), and M sixth column selection switches (Folumn1, Folumn2, Folumn3, . . . , FolumnM); each sixth detector unit includes a frequency selection surface, a PTAT circuit (temperature sensing circuit), and a sixth NMOSFET; the PTAT circuit is located under the frequency selection surface, and its output terminal is connected to an $M_{SEL5}$ terminal of the sixth NMOSFET; and an SEL5 terminal of the sixth NMOSFET is connected to a sixth column selection switch of a column where it is located, and a $V_{out5}$ terminal is connected to a sixth row selection switch of a column where it is located.

The frequency selection surface is a periodic structure surface that can exhibit different reflection/transmission properties in different frequency bands. It can be equivalent to a band pass or band stop filter, but it is different from the filter in that the reflection/transmission properties of the frequency selection surface is related to the polarization of the incident wave. To obtain a frequency selection surface with a band-pass response, its periodic structure unit must be a slotted structure. In the slotted structure, the Jerusalem cross trough-shaped frequency selection face has the same reflection/transmission response to incident waves in the vertical and horizontal polarization directions. When the terahertz wave is irradiated on the sensor, the frequency selection surface with high selectivity reflects the electromagnetic wave energy outside the band pass frequency, so that the electromagnetic wave within the band pass frequency enters the sensor structure. A large amount of current is induced on the frequency selection surface, and energy loss is generated together with the current and electric field in the medium and semiconductor structure, and is converted into heat, which causes the overall temperature of the sensor to rise. The temperature sensing circuit located under the frequency selection surface converts temperature changes into measurable electrical signals.

In the above, the first matching network and the second matching network both use grounded coplanar waveguide (GCPW) transmission lines.

In this embodiment, the specific working principle of the new terahertz spectrum analyzer is as follows:

A terahertz light wave is focused on the terahertz chip detector 9 through the terahertz near-optical lens 2, and then the terahertz chip detector 9 converts the terahertz light signal into an analog signal. Thereafter, the analog signal is converted by the digital and analog external circuit 7 into a digital signal, digital signal processing is then performed by the digital signal processor 4 and the field programmable logic array 5, and finally the processed signal is sent out through the signal external connector 8.

Specifically, the specific working principle (for example) of the terahertz chip detector 9 is as follows:

When the switch S1 is turned on and the switches S2, S3, S4, S5 and S6 are all turned off: the first row selection switch Aow1 and the column selection switch Aolumn1 are turned off, and the detector A11 converts a detected terahertz signal into a measurable electrical signal.

When the switch S2 is turned on and the switches S1, S3, S4, S5 and S6 are all turned off: the second row selection switch Bow1 and the column selection switch Bolumn1 are turned on, and the detector B11 converts a detected terahertz signal into a measurable electrical signal.

When the switch S3 is turned on and the switches S2, S1, S4, S5 and S6 are all turned off: the third row selection switch Eow1 and the column selection switch Eolumn1 are turned off, and the detector E11 converts a detected terahertz signal into a measurable electrical signal.

When the switch S4 is turned on and the switches S2, S3, S1, S5 and S6 are all turned off: the fourth row selection switch Cow1 and the column selection switch Column1 are turned off, and the detector C11 converts a detected terahertz signal into a measurable electrical signal.

When the switch S5 is turned on and the switches S2, S3, S4, S1 and S6 are all turned off: the fifth row selection switch Dow1 and the column selection switch Dolumn1 are turned off, and the detector D11 converts a detected terahertz signal into a measurable electrical signal.

When the switch S6 is turned on and the switches S2, S3, S4, S5 and S1 are all turned off: the sixth row selection switch Fow1 and the column selection switch Folumn1 are turned off, and the detector F11 converts a detected terahertz signal into a measurable electrical signal.

The working detectors are selected by a similar switch turning-on method, and the detection frequency range of each detector is overlapped but not completely consistent with each other. Therefore, if the frequency ranges of countless different detectors are used as the sub-bands of the terahertz spectrum analyzer, this embodiment can completely realize the terahertz spectrum analyzer with the widest coverage band range in the world.

The embodiments described above are only preferred embodiments of the present disclosure, and do not limit the scope of implementation of the present disclosure. Therefore, any changes made according to the shape and principle of the present disclosure should be covered by the scope of protection of the present application.

What is claimed is:

1. A new terahertz spectrum analyzer, comprising an outer packaging casing, a terahertz near-optical lens, a circuit board, a digital signal processor, a field programmable logic array, a power supply circuit, a digital and analog external circuit, a signal external connector and a terahertz chip detector;
   wherein the terahertz near-optical lens and the signal external connector are installed at two ends of the outer packaging casing, respectively; the circuit board, the digital signal processor, the field programmable logic array, the power supply circuit, the digital and analog external circuit and the terahertz chip detector are built in the outer packaging casing, and the digital signal processor, the field programmable logic array, the power supply circuit, the digital and analog external circuit and the terahertz chip detector are all integrated on the circuit board, and power is supplied by the power supply circuit to each circuit module;
   the terahertz chip detector is placed in the middle of the circuit board and faces the terahertz near-optical lens, and it is connected to the digital signal processor and the field programmable logic array through the digital and analog external circuit; and
   the circuit board, integrated with the digital signal processor, the field programmable logic array, the power supply circuit, the digital and analog external circuit and the terahertz chip detector, is connected to the signal external connector.

2. The new terahertz spectrum analyzer according to claim 1, wherein the terahertz chip detector is composed of an SBD detector array based on a multi-frequency terahertz antenna structure, a detector array based on a Schottky contact rasterization structure, an NMOSFET detector array based on a multi-frequency terahertz antenna structure, a detector array based on an NMOSFET gate rasterization structure, a detector array based on an HMET gate rasterization structure, a detector array based on a wave-heat conversion structure, and switches S1, S2, S3, S4, S5 and S6; and
   the SBD detector array based on the multi-frequency terahertz antenna structure, the detector array based on the Schottky contact rasterization structure, the NMOSFET detector array based on the multi-frequency terahertz antenna structure, the detector array based on the NMOSFET gate rasterization structure, the detector array based on the HMET gate rasterization structure, the detector array based on the wave-heat conversion structure are connect to an output terminal $D_{out}$ through the switches S1, S2, S4, S5, S3, and S6, respectively.

3. The new terahertz spectrum analyzer according to claim 2, wherein the SBD detector array based on the multi-frequency terahertz antenna structure comprises N×M first detector units, N first row selection switches, and M first column selection switches;
   wherein each first detector unit comprises a first multi-frequency-point terahertz antenna, a first matching network having transmission lines TL1, TL2, and TL3, a DC blocking capacitor C1, a bias voltage Vb1, a bias resistor Rb1, a first SBD, and a first NMOSFET;
   the multi-frequency-point terahertz antenna is connected to a left port of the transmission line TL1, a right port of the transmission line TL2 is connected to an anode of the first SBD, a cathode of the first SBD is grounded, and the bias voltage Vb1 and the bias resistor Rb1 are loaded on the anode of the first SBD for supplying power to the first SBD; a lower end of the transmission line TL3 is separately connected to one end of the DC blocking capacitor C1 and an $M_{SEL}$ terminal of the first NMOSFET; the other end of the DC blocking capacitor C1 is grounded; and an SEL terminal of the first NMOSFET is connected to a first column selection switch in a column where it is located, and a $V_{out}$ terminal of the first NMOSFET is connected to a first row selection switch in a row where it is located;
   the N first row selection switches are all connected to the switch S1; and
   port impedance of the multi-frequency-point terahertz antenna is consistent with left port impedance of the transmission line TL1, the left port impedance of the transmission line TL1 is consistent with right port impedance of the transmission line TL2, and the right port impedance of the transmission line TL2 is consistent with port impedance of the anode of the Schottky diode.

4. The new terahertz spectrum analyzer according to claim 2, wherein the detector array based on the Schottky contact rasterization structure comprises N×M second detector units, N second row selection switches, and M second column selection switches;
   wherein each second detector unit comprises a second SBD with a Schottky contact rasterization structure, a DC blocking capacitor C2, a bias voltage Vb2, a bias resistor Rb2, and a second NMOSFET;
   a cathode of the second SBD is grounded, and the bias voltage Vb2 and the bias resistor Rb2 are loaded on an anode of the second SBD for supplying power to it; and the anode of the second SBD is connected to one end of the DC blocking capacitor C2, and the other end of the DC blocking capacitor C2 is connected to an $M_{SEL1}$ terminal of the second NMOSFET, an SEL1 terminal of the second NMOSFET is connected to a second column selection switch in a column where it is located, and a $V_{out1}$ terminal of the second NMOSFET is connected to a second row selection switch in a row where it is located; and
   the N second row selection switches are all connected to the switch S2.

5. The new terahertz spectrum analyzer according to claim 4, wherein the second SBD with the Schottky contact rasterization structure is an SBD in which the anode is converted into a rasterization structure, and has a trench that forms a raster-like structure.

6. The new terahertz spectrum analyzer according to claim 2, wherein the NMOSFET detector array based on the multi-frequency terahertz antenna structure comprises N×M third detector units, N third row selection switches, and M third column selection switches;

wherein each third detector unit comprises a second multi-frequency-point terahertz antenna, a second matching network having transmission lines TL4 and TL5, a field effect transistor, a bias voltage Vb3, a bias resistor Rb3, and a third NMOSFET;

the second multi-frequency-point terahertz antenna is connected to a left port of the transmission line TL4, a right port of the transmission line TL4 is connected to an M1 port of the field effect transistor, and the bias voltage Vb3 and the bias resistor Rb3 are loaded on a gate of the field effect transistor for supplying power to the field effect transistor;

the transmission line TL5 is connected to the gate of the field effect transistor for eliminating the influence of the gate DC bias on the impedance matching between the antenna and the transistor;

a drain of the field effect transistor is connected to an $M_{SEL2}$ terminal of the third NMOSFET, an SEL2 terminal of the third NMOSFET is connected to a third column selection switch of a column where it is located, and a $V_{out2}$ terminal of the third NMOSFET is connected to a third row selection switch of a row where it is located;

the N third row selection switches are all connected to the switch S4; and port impedance of the second multi-frequency-point terahertz antenna is consistent with left port impedance of the transmission line TL4, and right port impedance of the transmission line TL4 is consistent with M1 port impedance of the field effect transistor.

7. The new terahertz spectrum analyzer according to claim 2, wherein the detector array based on the NMOSFET gate rasterization structure comprises N×M fourth detector units, N fourth row selection switches, and M fourth column selection switches;

wherein each fourth detector unit comprises an NMOSFET with a gate rasterization structure, a bias voltage Vb4, a bias resistor Rb4, and a fourth NMOSFET;

a source of the NMOSFET with the gate rasterization structure is grounded, a drain is connected to an $M_{SEL3}$ terminal of the fourth NMOSFET, an SEL3 terminal of the fourth NMOSFET is connected to a fourth column selection switch in a column where it is located, and a $V_{out3}$ terminal of the fourth NMOSFET is connected to a fourth row selection switch of a row where it is located;

the bias voltage Vb4 and the bias resistor Rb4 are loaded on a gate of the NMOSFET with the gate rasterization structure for supplying power to the NMOSFET with the gate rasterization structure; and the N fourth row selection switches are all connected to the switch S5.

8. The new terahertz spectrum analyzer according to claim 2, wherein the detector array based on the HMET gate rasterization structure comprises N×M fifth detector units, N fifth row selection switches, and M fifth column selection switches; and wherein each fifth detector unit comprises a HEMT with a gate rasterization structure and a fifth NMOSFET; a source of the HEMT with the gate rasterization structure is grounded, and a drain is connected to an $M_{SEL4}$ terminal of the fifth NMOSFET; and an SEL4 terminal of the fifth NMOSFET is connected to a fifth column selection switch in a column where it is located, and a $V_{out4}$ terminal is connected to a fifth row selection switch in a row where it is located.

9. The new terahertz spectrum analyzer according to claim 1, wherein the detector array based on the wave-heat conversion structure comprises N×M sixth detector units, N sixth row selection switches, and M sixth column selection switches; and wherein each sixth detector unit comprises a frequency selection surface, a PTAT circuit, and a sixth NMOSFET; the PTAT circuit is located under the frequency selection surface, and its output terminal is connected to an $M_{SEL5}$ terminal of the sixth NMOSFET; and an SEL5 terminal of the sixth NMOSFET is connected to a sixth column selection switch of a column where it is located, and a $V_{out5}$ terminal is connected to a sixth row selection switch of a column where it is located.

\* \* \* \* \*